United States Patent [19]

Ackland et al.

[11] 4,412,313

[45] Oct. 25, 1983

[54] RANDOM ACCESS MEMORY SYSTEM HAVING HIGH-SPEED SERIAL DATA PATHS

[75] Inventors: Bryan D. Ackland, East Windsor; Neil H. E. Weste, Eatontown, both of N.J.

[73] Assignee: Bell Telephone Laboratories, Incorporated, Murray Hill, N.J.

[21] Appl. No.: 226,462

[22] Filed: Jan. 19, 1981

[51] Int. Cl.³ .......................... G11C 7/00; G11C 8/00
[52] U.S. Cl. .................................. 365/221; 365/205; 365/240
[58] Field of Search ............... 365/205, 221, 239, 240

[56] References Cited

U.S. PATENT DOCUMENTS

| | | | |
|---|---|---|---|
| 3,763,480 | 10/1973 | Weimer | 365/238 |
| 4,044,339 | 8/1977 | Berg | |
| 4,106,109 | 8/1978 | Fassbender | 365/238 |
| 4,120,048 | 10/1978 | Fuhrman | 365/239 |
| 4,144,590 | 3/1979 | Kitagawa et al. | 365/205 |
| 4,330,852 | 5/1982 | Redwine et al. | 365/205 |
| 4,347,587 | 8/1982 | Rao | 365/221 |

OTHER PUBLICATIONS

Proebsting, "Dynamic MOS RAMS Technology", 1979 Mostek Memory Data Book and Designers Guide, 3/79, pp. 233-238.

*Primary Examiner*—Stuart N. Hecker
*Attorney, Agent, or Firm*—Ronald D. Slusky; David H. Tannenbaum

[57] ABSTRACT

To substantially increase the bandwidth of a random access memory (RAM), a shift register is disposed within the memory array such that the shift register lies parallel to the word lines and is connected to at least individual ones of the bit lines contained within the array. Separate high-speed serial input and output lines are provided by the shift register. These lines are in addition to and operate independently of the slower speed input and output lines normally provided by the RAM. Through this arrangement, a row of data can be transferred to and from the memory array at a rate substantially faster than the single-bit access rate of the RAM.

11 Claims, 5 Drawing Figures

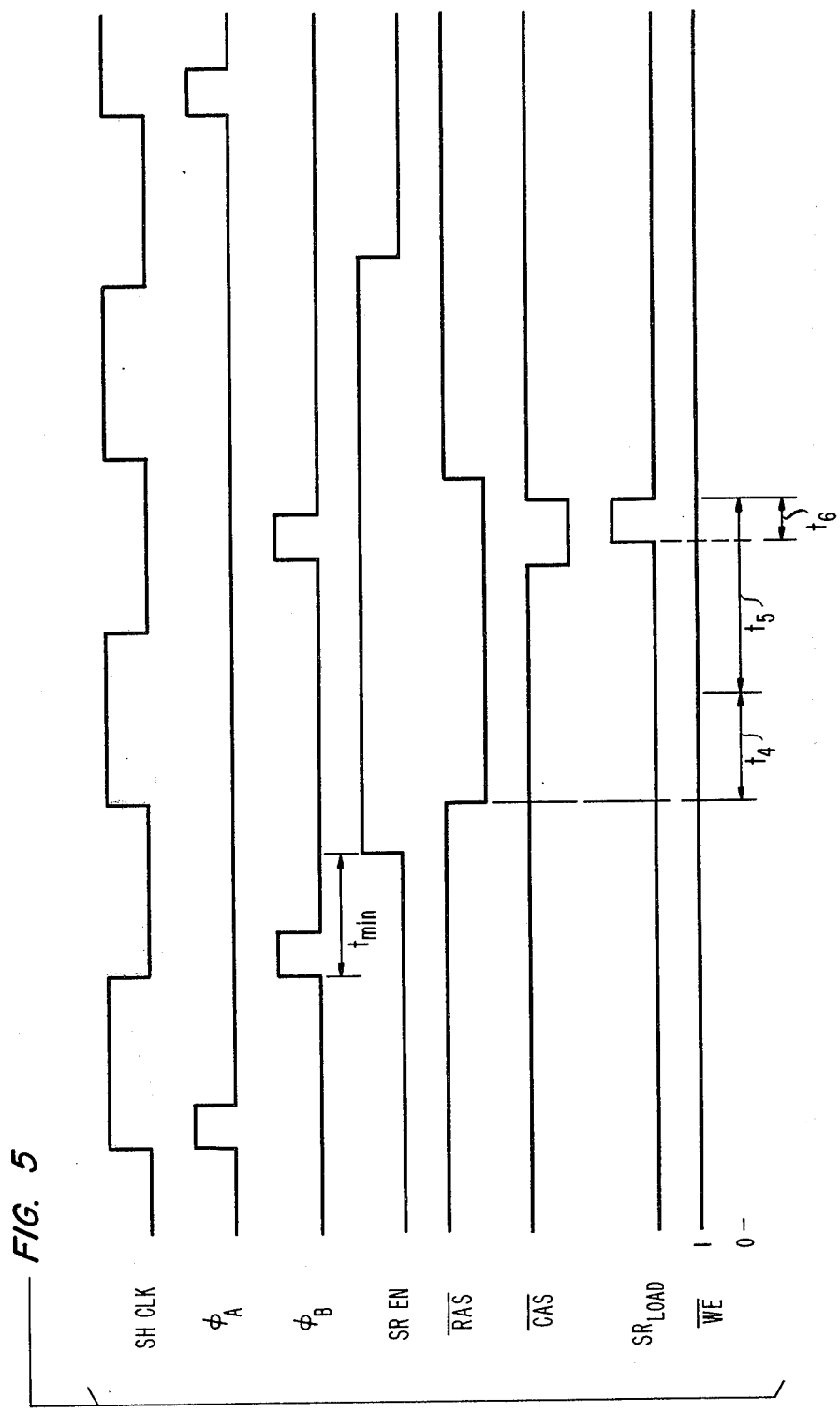

RANDOM ACCESS MEMORY SYSTEM HAVING HIGH-SPEED SERIAL DATA PATHS

BACKGROUND OF THE INVENTION

This invention relates to an improved architecture for a random access memory.

In the area of digital signal processing, random access memories (RAMs) have been used for years as a means of storing digital data. A typical integrated circuit RAM contains a memory array, circuitry—typically row and column decoders—which addresses selected memory elements, or locations, within that array, and input/output circuitry. The memory array contains a plurality of intersecting row and column lines arranged in a grid. One memory element, capable of holding, for example, one bit of information, is provided at the point of intersection of every row and column line.

Memory elements can be classified as either static or dynamic. Dynamic memory elements are those in which the value of any data stored therein slowly decays with time. To preserve the stored data for an indefinite time, each dynamic memory element must be periodically read and its contents written back with the same data. This process is known as refresh. Static memory elements, on the other hand, are those capable of storing data for an indefinite period of time without refresh.

To access information stored within a RAM, a portion of an address supplied to the memory is applied to the row decoder. In response to this portion, the row decoder selectively energizes a particular one of the plurality of row (or word) lines. Each bit in a resulting accessed row is then read onto a respective column (or bit) line. A sense amplifier connected to each bit line detects the level of the bit present on that line, and amplifies it to a higher level. In the case of a RAM comprised of dynamic memory elements, the resulting amplified bit is then applied to the same bit line in order to facilitate refresh. In response to the remainder of the address, the column decoder in conjunction with the input/output circuitry applies the amplified bit present on a selected one of the bit lines to the memory output.

Over the past few years, a variety of RAM technologies have been developed, e.g., RAMs containing bipolar memory elements and those containing metal oxide semiconductor (MOS) elements. The former have significantly faster access speeds than the latter. However, bipolar based memories consume a relatively large amount of power, contain relatively few locations per chip, and are expensive. Advantageously, MOS RAMs not only consume far less power, but also can be provided at a much lower price than bipolar. Moreover, recent developments in the design of digital integrated circuits have led to significant decreases in the physical size of individual MOS memory elements, and correspondingly have provided significant increases in the storage capacity of individual MOS RAM chips. Consequently, the number of MOS memory chips required to implement a memory system of given storage capacity, i.e., the "chip count," has significantly decreased.

However, various physical constraints on the design of MOS RAMs, for example, substantial internal capacitances and limited chip pinout, have generally prevented the bandwidth of a MOS RAM, i.e., the amount of data that can be transferred into or out of the memory chip per unit time, from being increased. Consequently, decreasing the chip count of an MOS based memory system of given storage capacity causes a reduction in the overall bandwidth. Thus, in those applications where the operating speed of the digital system is primarily determined by memory bandwidth, e.g., video frame stores, use of relatively inexpensive, high capacity MOS RAMs is no longer being favored over more expensive, less dense RAMs.

Various approaches aimed at increasing the bandwidth of a MOS RAM have been disclosed in the art. In particular, C. J. Fassbender in U.S. Pat. No. 4,106,109 issued Aug. 8, 1978, teaches that the access rate of a multi-array MOS RAM can be increased by storing the bit produced by each array during a memory read operation in a separate register, positioned external to the memory arrays, prior to applying these bits to the output circuitry. Disadvantageously, this arrangement only increases access speed during a memory read operation and requires a significant amount of area on the integrated circuit for routing the leads connecting the register to the existing memory circuitry. Alternatively, Kitagawa et al, in U.S. Pat. No. 4,144,590, issued Mar. 13, 1979, teach that access speed can be increased by amplifying the output signal of each sense amplifier prior to applying it to a respective bit line. However, while this arrangement requires a small amount of additional circuitry, the increase in access speed produced thereby is insufficient to overcome the bandwidth limitation in a typical high-capacity, low chip-count MOS based memory system.

SUMMARY OF THE INVENTION

In accordance with the present invention, the bandwidth of an integrated circuit RAM is increased, while requiring a minimal amount of additional on-chip circuitry, and while retaining its random access capability, by disposing a shift register within the memory array such that the shift register lies substantially parallel to the memory element rows and is connected to at least individual ones of the bit lines. Once a word line is energized, and the amplified bits are provided on each bit line, those bits are applied not only to the input/output circuitry, but also to respective locations in the shift register. The bits can thereafter be read out of the register as a serial data stream at a rate substantially higher than the single-bit random access rate. Writing is accomplished by serially applying the input bits to the shift register and subsequently applying these bits in parallel from the shift register to the respective bit lines, whence they are written into a selected row. The invention thus provides the ability to concurrently transfer a row of bits to and from the random access memory.

The above-described structure allows a row of bits to be transferred to or from the memory array within the time required for one conventional random memory access. This information can then be read out at a rate limited only by the speed of the shift register. Advantageously, then, a substantial increase in access speed and bandwidth results over that obtainable with prior art MOS RAMs.

In preferred embodiments of the invention, the shift register is positioned so as to be intersected by the bit lines, thereby requiring minimal amount of lead routing between the register and the bit lines. Consequently, this arrangement is advantageously simple and inexpensive to implement.

As a result, MOS RAMs and high capacity, low chip count MOS RAM based memory systems incorporating the teachings of this invention may advantageously be used in applications heretofore reserved for expensive, less dense technologies.

BRIEF DESCRIPTION OF THE DRAWING

The invention may be clearly understood from a consideration of the following detailed description and accompanying drawing in which:

FIG. 5 is a diagram showing the timing relationships between the various control signals required to transfer all the data bits from a selected row of the memory array into respective locations of the shift register.

DETAILED DESCRIPTION

Figure 1:
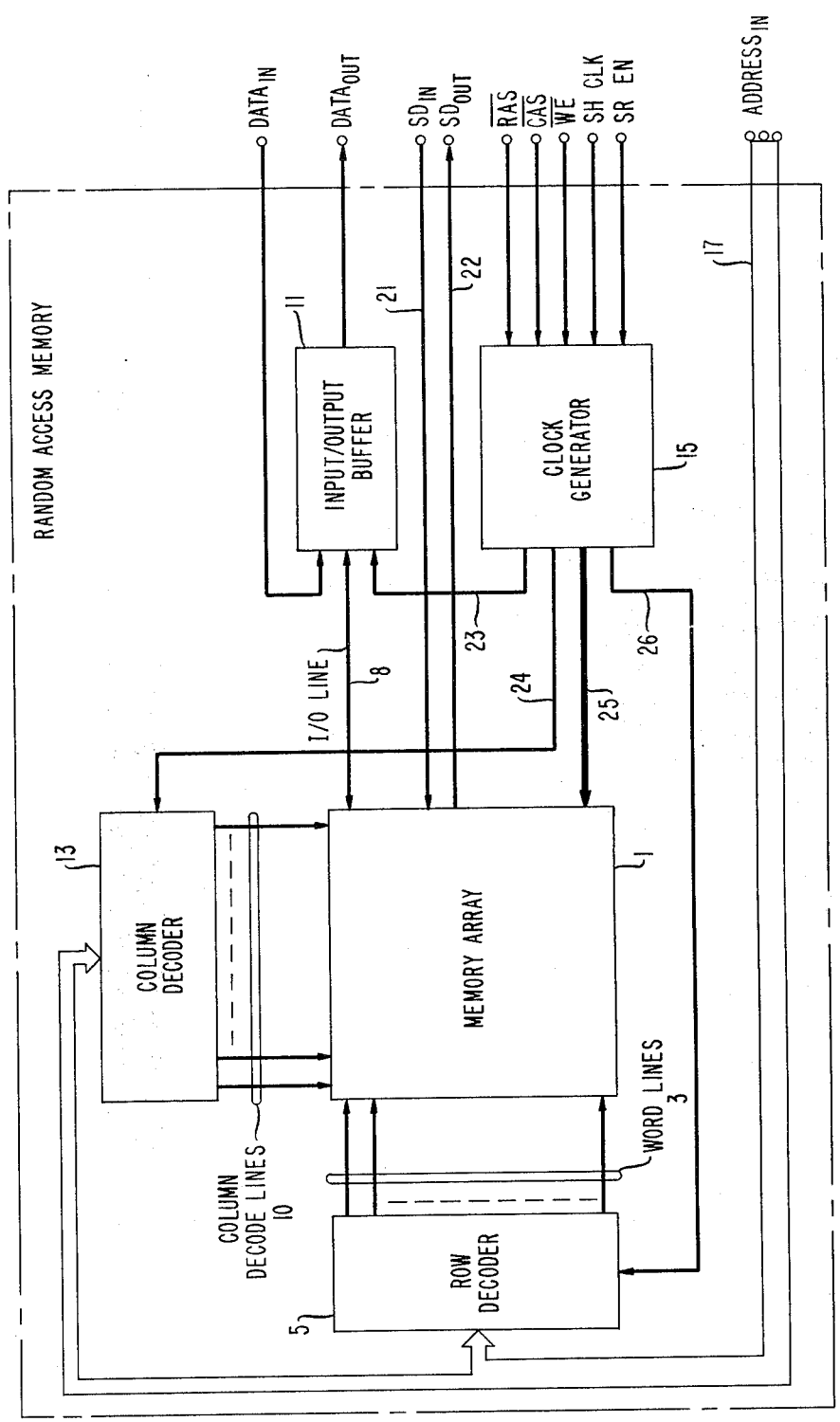
FIG. 1 is a block diagram of a random access memory (RAM)

FIG. 1 depicts a block diagram of a random access memory (RAM). The RAM includes a memory array 1 having a plurality of addressable memory elements 30 arranged in intersecting rows and columns. Illustratively, each memory element is capable of storing one bit of data. As described below, memory array 1 incorporates the teachings of the present invention. Also included in the RAM are row decoder 5, column decoder 13, input/output buffer 11 and clock generator 15. These latter blocks are all of conventional construction and are well known to RAM designers.

To read the data bit stored within a particular memory element, a binary address of that element is externally supplied to the RAM via the ADDRESS IN pins and extended to the decoder circuitry by address bus 17. In addition, a high to low level transition is applied to pin $\overline{RAS}$ (Read Address Strobe). Clock generator 15 responds to this transition by applying a clock signal to row decoder 5 via lead 26. Row decoder 5, in turn, responds to this clock signal and a portion of the address present on address bus 17 to energize one of word lines 3 corresponding to that address portion. Subsequently, in response to a high to low level transition applied to pin $\overline{CAS}$ (Column Address Strobe), clock generator 15 applies a clock signal to column decoder 13 via lead 24. Column decoder 13, in turn, responds to this signal and to the remainder of the address present on address bus 17 to energize one of the column decode lines 10 corresponding to that address portion. The bit stored within the memory element lying at the intersection of the selected row and column is then applied by the circuitry within memory array 1, via input/output line 8, to input/output buffer 11, wherein the bit is temporarily stored. Shortly thereafter, clock generator 15, via lead 23, signals input/output buffer 11 to apply its contents, as the memory's output, to output pin DATA OUT.

Writing is accomplished by substantially the reverse process. In particular, an input data bit is applied to pin DATA IN, and the desired address of that data bit is externally applied to the RAM through the ADDRESS IN pins. This is followed by high to low level transitions on input pins $\overline{WE}$ (Write Enable) and $\overline{RAS}$, followed after a predetermined period of time by a similar transition applied to pin $\overline{CAS}$.

Figure 2:
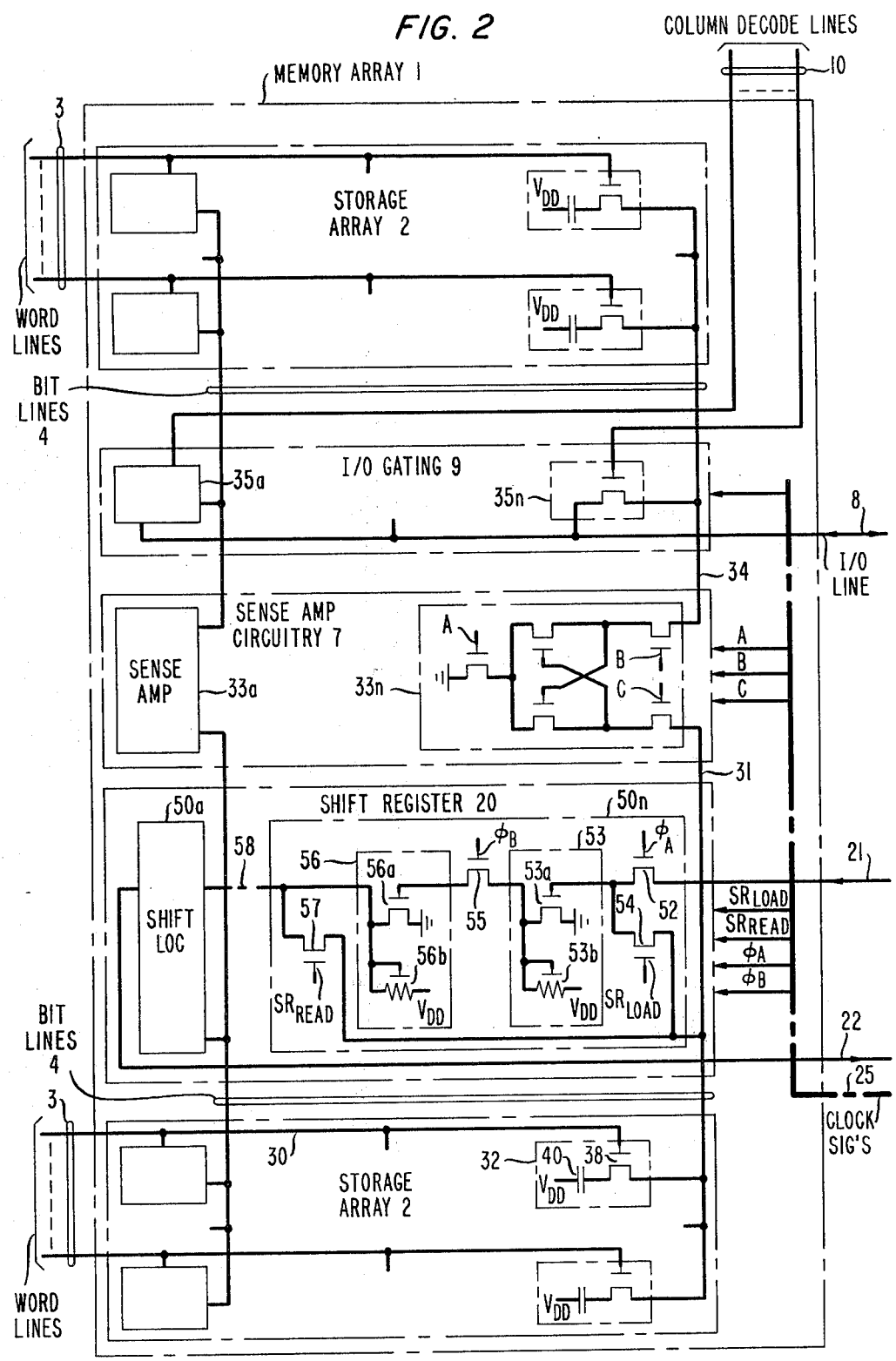
FIG. 2 is a block diagram of a memory array used in the memory of FIG. 1 which, more particularly, incorporates the teachings of the present invention.

FIG. 2 is a block diagram of memory array 1 (shown in FIG. 1) which incorporates the teachings of the present invention. Memory array 1 is illustratively comprised of two separate storage arrays 2. Each storage array contains half of the above-mentioned addressable word lines 3 and n bit lines 4, the word and bit lines being arranged in an intersecting grid. A memory element, e.g., memory element 32, lies at the intersection of each word and bit line within each one of storage arrays 2. In particular, this memory element is comprised of MOS transistor 38 and capacitor 40. A data bit of value "1", for example, is stored within this memory element as the presence of a small quantity of electrical charge stored in capacitor 40.

Sense amplifier circuitry 7 and input/output gating 9 are centrally positioned between storage arrays 2 and are connected to every bit line within memory array 1. Circuitry 7 includes sense amplifiers 33$a$–33$n$, illustrative basic circuitry of sense amplifier 33$n$ being explicitly shown. Circuitry 7, and clock signals A, B and C which control it, are both well known in the art, and as such will not be described. See, for example, 1979 *Mostek\* Memory Data Book and Designer Guide*, pages 236–238.

\*Trademark of Mostek Corporation

To read the data bit stored within memory element 32, for example, the associated one of word lines 3—word line 30—is energized by row decoder 5 as previously described. This causes the transistor in each memory element on word line 30 and, in particular, transistor 38, to conduct. If a "1" was previously stored within, for example, memory element 32, the charge existing within capacitor 40 is thereby transferred via transistor 38 to the associated one of bit lines 4—bit line 31. If a "0" was previously stored in this memory element, capacitor 40 will contain no charge, and none will be transferred to the bit line.

Assume, in particular, that a "1" has been stored in memory element 32. The charge transferred from memory element 32 to bit line 31 will generate a small voltage, for example, on the order of several hundred millivolts, on this bit line because the capacitance associated with bit line 31 is substantially greater than that of capacitor 40. To accurately detect this voltage, sense amplifier 33$n$ receives a reference voltage present on another one of bit lines 4—bit line 34. The latter voltage is approximately midway between two extremes of voltage expected on bit line 31 resulting from memory element 40 being either in a charged or discharged condition and is produced by a dummy memory element (not shown) located on bit line 34. This dummy memory element is read whenever a memory element connected to bit line 31 is read. (Voltages produced by dummy memory elements located on each of the other upper bit lines are, at the same time, read onto their respective bit lines). Sense amplifier 33$n$ hereafter differentially amplifies the signals present on bit lines 31 and 34 and applies the resulting amplified data bit to these same bit lines. This latter operation preserves the data bit in memory element 32 in that it replenishes the stored charge previously taken from that element. This operation is commonly known as "refreshing".

In addition, the amplified data bit on bit line 34 is received by transistor 35$n$ within input/output gating 9.

As previously described, a column decode signal from column decoder 13 is thereafter applied to one of column decode lines 10. This signal, received at the gate of transistor 35n, causes transistor 35 to conduct and thereby transfer the signal present on bit line 34 to input/output line 8.

To write into memory element 32, a process using a data path essentially the reverse of that described above is used. In particular, an input data bit, for example a "1", is applied to input/output line 8. A column decode signal from column decoder 13 is applied to transistor 35n causing it to transfer the data bit on input/output line 8 to sense amplifier 33n via bit line 34. Concurrently, word line 30 is energized causing transistor 38 within memory element 32 to conduct. Sense amplifier 33n, in response to clock signals produced by clock generator 15, amplifies the input data bit and subsequently applies it to bit line 31. From there, conducting transistor 38 routes the data bit into memory element 40 wherein this bit value is preserved as a stored charge. On the other hand, if the value of this input data bit had been a "0", memory element 40 would be discharged.

Over the last few years, changing techniques of MOS design and manufacture have produced significant decreases in the physical size of individual MOS memory elements, e.g., element 32. This has dramatically increased the number of memory elements that can comprise a single memory array of a given chip area. As a result, the number of MOS memory chips required to implement a memory system has significantly decreased. However, various physical constraints on the design of MOS RAMS, for example, substantial internal capacitances and limited chip pinout, have generally prevented the bandwidth of a MOS RAM, i.e., the amount of data that can be transferred into or out of the memory chip per unit time, from being increased. Consequently, decreasing the chip count of an MOS based memory system causes a reduction in the overall bandwidth. Thus, the use of high density MOS RAMs has been limited in those applications e.g., video frame stores, where the operating speed of the system is primarily determined by the memory bandwidth.

The present invention is directed to an arrangement for providing a RAM with a substantially increased bandwidth while (a) minimizing the need for additional circuitry and chip area and (b) retaining its random access capability. In accordance with the invention, this is achieved by disposing a shift register within the memory array such that it lies parallel to the word lines and is connected to at least some of the bit lines. High-speed serial input and output lines are provided by the shift register and operate independently of the slower speed input and output lines normally provided by the RAM.

Through this arrangement, a row of data bits can be either written into or read from the memory array at high speed. In particular, to write a row of data bits into the memory array, these data bits are first applied as a high-speed data stream to the serial input line. Once stored within the shift register, all the bits comprising the row are simultaneously applied to respective bit lines through which they are routed to and stored within a previously accessed row. Alternatively, to read an accessed row, all the bits comprising that row are first simultaneously read from the memory and stored in respective locations within the shift register. Thereafter, they are shifted out of the shift register and applied to the serial output line as a high-speed serial bit stream. Thus, through this arrangement, a row of data bits can be transferred either into or out of the memory array in the time required for one single bit random memory access and then serially shifted out at high speed.

As a result of its substantially increased bandwidth, this arrangement can be advantageously used in any system wherein operating speed is predominantly determined by memory bandwidth. One such application is video frame store memories. In particular, each row of bits within the RAM can correspond to one line of information on a video display, e.g., cathode ray tube, terminal. With this arrangement, a line of information can be transferred between the frame store memory and the display in considerably less time than would be required to access the line conventionally, i.e., randomly accessing each location comprising that line. Consequently, this will significantly reduce the time required to refresh the display and will thereby significantly increase the operating speed of the system. At the same time, the fact that the random access capability of the memory is retained means that the stored video image can be efficiently updated. In addition, since only one random access is required to display each line of video information, the rest of the random access memory bandwidth is available for updating the display.

In the present illustrative embodiment, in particular, shift register 20 is oriented parallel to word lines 3 and is located in the vicinity of the midpoint of bit lines 4. More particularly, shift register 20 is connected to half the bit lines within memory array 1, and, even more particularly, those lines of bit lines 4 which feed the lower one of storage arrays 2. Shift register 20 contains as many shift locations, 50a, ..., 50n, as there are bit lines connected to the lower one of storage arrays 2. Both the parallel input and output of each storage location is connected to a respective bit line. Additionally, a serial input signal $SD_{IN}$ from pin $SD_{IN}$ (Shift Data Input—shown in FIG. 1) is extended via lead 21 to shift register 20 and a serial output signal from shift register 20 is extended via lead 22 to output pin $SD_{OUT}$ (Shift Data Output—also shown in FIG. 1). Operation of shift register 20 in conjunction with the rest of memory array 1 will now be described.

Shift location 50n, for example, is comprised of inverters 53 and 56 and transistors 52, 54, 55 and 57. Inverters 53 and 56 are comprised of MOS transistors 53a and 56a, respectively, and MOS resistors 53b and 56b, respectively. A data bit is stored in shift location 50n through the presence of absence of a stored charge at the input of both inverters, i.e., the gates of transistors 53a and 56a. Because the input impedance of these transistors is substantial, charge can be retained at these inputs for a relatively long period of time. Transistors 52 and 55 perform the shifting function. The rate of shifting is determined by the frequency of clock signal SH CLK continuously applied to pin SH CLK (Shift Clock—shown in FIG. 1). The rate of this clock signal can be independent of the rate of any other control signal applied to the RAM. Its value need only be sufficiently high to enable all the data bits stored within the shift register to be serially shifted into or out of the register at a rate determined by the desired memory bandwidth.

Figure 3:
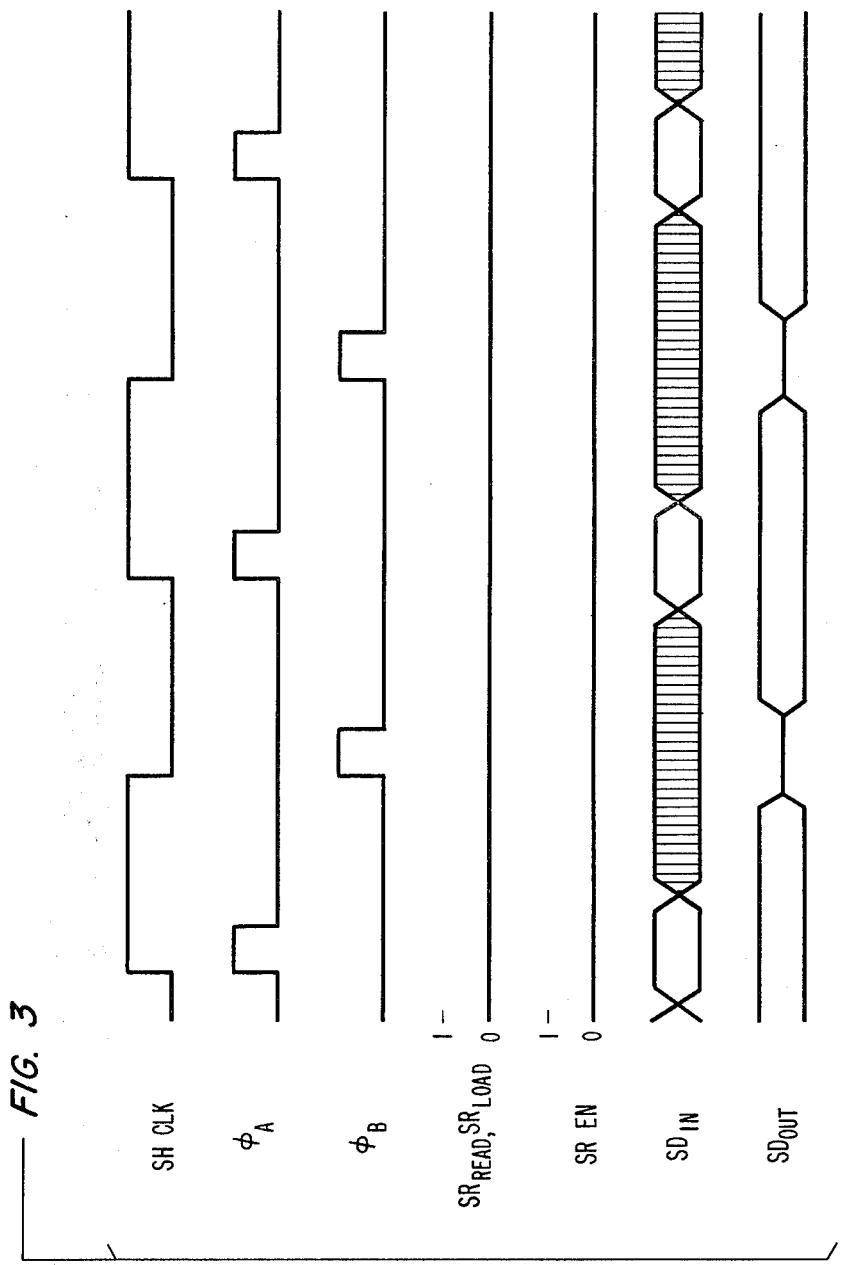
FIG. 3 is a diagram showing the timing relationships between the various control signals needed to shift data bits through a shift register used in the memory array of FIG. 2.

In particular, clock generator 15 responds to clock signal SH CLK and produces a non-overlapping two-phase shift clock signal to control the shift function. This clock signal is comprised of phases $\Phi_A$ and $\Phi_B$ which are shown in FIG. 3. A positive pulse occurs on phase $\Phi_A$ followed by a positive pulse on phase $\Phi_B$.

Phase $\Phi_A(\Phi_B)$ is applied to the gate of transistor 52 (55). Whenever a pulse on phase $\Phi_A$ occurs, a serial input data bit from serial input signal $SD_{IN}$ present on lead 21 is transferred to the input of inverter 53 via conducting transistor 52. The input data bit need only be valid during the non-shaded intervals of signal $SD_{IN}$ as shown in FIG. 3. Inverter 53 inverts the serial input data bit and applies it to the source lead of transistor 55. The following pulse of clock phase $\Phi_B$, causes transistor 55 to conduct, thereby completing the shift into shift location 50n by transferring the inverted data bit to the input of inverter 56. Thereafter, the original value of the data bit appears at the output of inverter 56 and is applied via lead 58 to the input of the following shift location (not shown).

Throughout shifting, control signal SR EN (Shift Register Enable) remains low. This control signal, when low, signals clock generator 15 that a data transfer operation between the memory array and the shift register is not to be initiated. This causes clock generator 15 to place a low level on control signals $SR_{READ}$ (Shift Register Read) and $SR_{LOAD}$ (Shift Register Load)—both of which will be discussed below. This prevents switching transistors 57 and 54 from conducting. The input and output of shift location 50n are thereby disconnected from bit line 31, thus effectively isolating the data stored therein from this bit line. Since a similar operation occurs involving each of the other shift locations, shift register 20 is effectively decoupled from memory array 1. This thus ensures that data can be shifted within shift register 20 not only at a rate solely determined by the frequency of signal SH CLK, but, more importantly, without interfering with any random access operation undertaken involving memory array 1.

Once data has been shifted into the shift register 20, the data bits stored in its respective shift locations are simultaneously transferred in parallel to respective ones of bit lines 4. For better understanding, reference should be made throughout the following discussion not only to FIG. 2, but also to FIG. 4, the latter depicting the proper timing relationship among the necessary control signals.

In particular, to initiate a row transfer from the shift register to one of the memory arrays, the level of control signal SR EN is raised after at least a minimum time interval, $t_{min}$, has elapsed after the rising edge of clock phase $\Phi_B$. Any shifts in progress are completed during this interval. During the time that control signal SR EN remains raised, clock generator 15, suspends the normal sequence of clock phases $101_A$ and $\Phi_B$, thereby precluding, during a row transfer operation, shifting of data among the shift locations of shift register 20. Shortly after the level of control signal SR EN is raised, the level of control signals $\overline{RAS}$ applied to pin $\overline{RAS}$ and $\overline{WE}$ applied to pin $\overline{WE}$ are lowered. In response to the transition on control signal $\overline{RAS}$, the RAM addressing circuitry during interval $t_1$ accesses a particular row within the memory array. The transition on control signal WE indicates to clock generator 15 that a memory write operation is to be initiated. There is, of course, no need to refresh the accessed row when, as in this instance, data is being transferred into it from the shift register. However, to simplify the circuitry of sense amplifiers 7 and clock generator 15, the refresh operation is automatically evoked whenever a row is accessed, regardless of whether a memory read or write operation is being undertaken. During time interval $t_2$, the contents of the accessed row are applied to the bit lines and the locations comprising that row are thereafter refreshed by sense amplifiers 7.

Once the refresh operation is complete, such as at the beginning of time interval $t_3$, control signal $\overline{CAS}$ is lowered. This causes clock generator 15 to produce a pulse on control signal $SR_{READ}$. This pulse causes MOS transistor 57 within shift location 50n and the corresponding transistors in each of the other shift locations of shift register 20 to conduct, thereby transferring the contents of each shift location to the associated bit line. For example, transistor 57 when conducting causes the contents of storage location 50n present on lead 58 to be applied to bit line 31. As a result, the contents of the accessed row in the memory array are over-written by the data bits stored in the shift register.

In addition it will be readily appreciated that with the addition of well-known control circuitry, a single bit could be written, using the memory accessing circuitry, into any location within the accessed row using a bit applied to the DATA IN pin. This operation could be used, for example, to update the value of a particular bit located within the transferred row in the event its value changes from the time the row has been shifted into the shift register and the time the row is transferred into the memory array. At the conclusion of the row transfer and single bit write operations, the level of control signal SR EN is lowered to once again permit shifting to occur.

The data bits comprising a selected row within the memory array can also be simultaneously transferred in parallel from that row to respective locations in the shift register and thereafter shifted out at high speed. The bits shifted out of the shift register comprise the serial output signal $SD_{OUT}$. For better understanding, reference should be made throughout the following discussion, not only to FIG. 2, but also to FIG. 5, the latter depicting the proper timing relationships among the necessary control signals.

Figure 4:
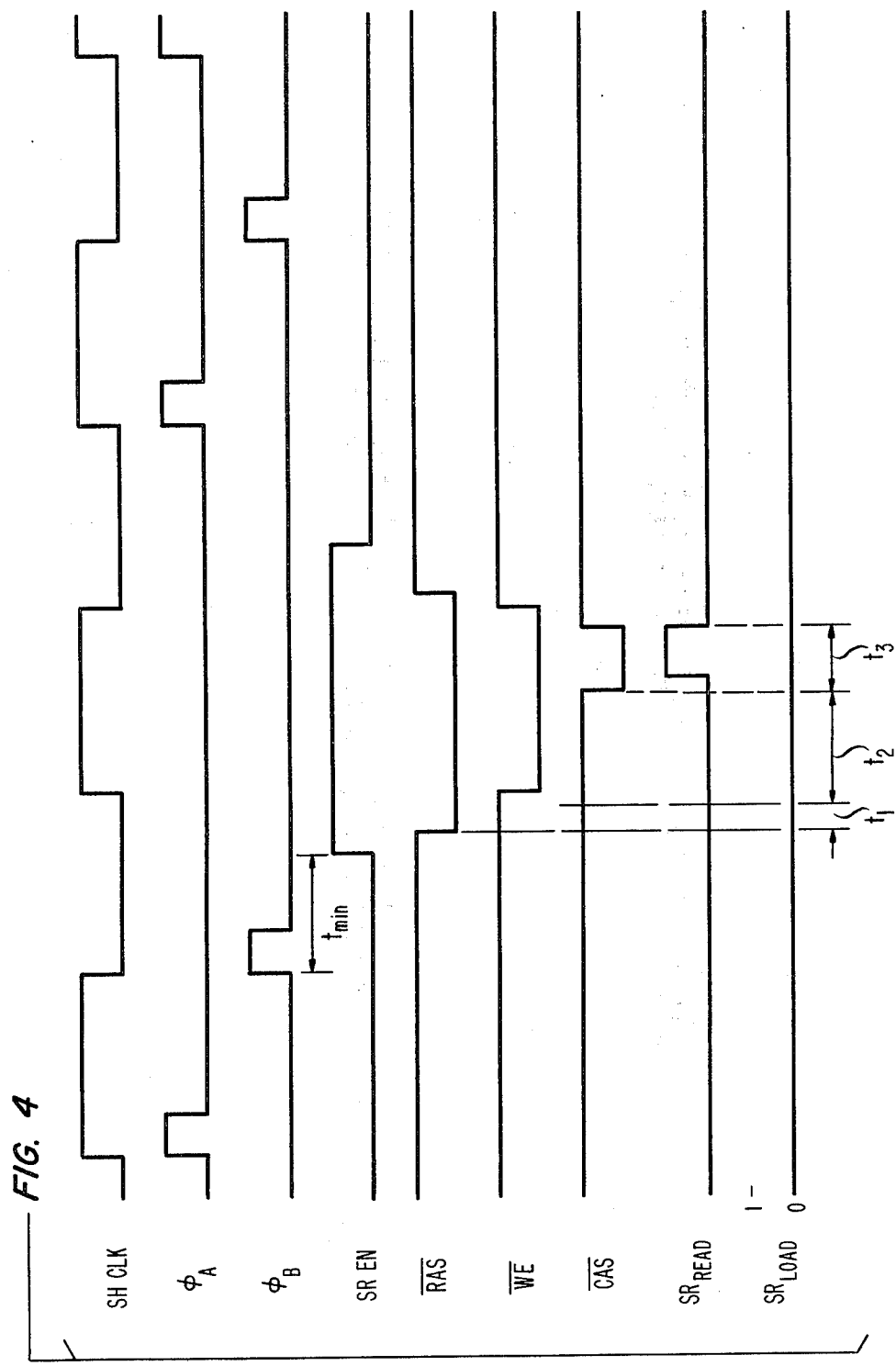
FIG. 4 is a diagram showing the timing relationships between the various control signals needed to simultaneously transfer data bits stored within the shift register into a selected row within the memory array.

To initiate this data transfer, as in FIG. 4, the level of control signal SR EN is raised after the previously described interval of time, $t_{min}$, has elapsed after the rising edge of clock pulse $\Phi_B$. Thereafter, the level of control signal $\overline{RAS}$ is lowered. This initiates a memory read during interval $t_4$ and subsequent refresh of a selected row of the memory array by sense amplifers 7 during interval $t_5$. Once the refresh is complete, control signal $\overline{CAS}$ is lowered. In response thereto, clock generator 15 produces a positive pulse in both control signal SR LOAD, and clock phase $\Phi_B$. Together, the effect of these pulses is to transfer the data bit present on each bit line into the corresponding shift location within shift register 20 during time interval $t_6$. For example, the data bit present on bit line 31 is transferred through MOS transistor 54, inverter 53, and MOS transistor 55 to the proper position within shift location 50n, i.e., at the input of inverter 56. Again it will be readily appreciated that with the addition of well-known circuitry, a single data bit could be read—once this row transfer is completed—from any location within the accessed row using the memory accessing circuitry. At the conclusion of the row transfer and single bit read operations, the level of control signal SR EN is lowered to once again permit shifting.

While a preferred embodiment has been described in terms of MOS components, it should be clearly understood that the teachings of the present invention, as will be obvious to those skilled in the art, are applicable to any memory technology which employs a memory comprised of individual memory elements, as a way of substantially increasing the bandwidth of that memory. Consequently, many and varied arrangements embodying these teachings may be derived by those skilled in the art without departing from the spirit and scope of the invention.

What is claimed is:

1. A random access memory having a storage array of memory elements arranged in rows and columns, comprising a plurality of bit lines arranged such that each bit line runs parallel to a respective one of the columns and is connected to at least individual ones of the memory elements in said respective one of the columns, shift register means directly connected to at least individual ones of said bit lines and positioned within said random access memory substantially at the midpoint of said array, and means responsive to address signals applied to said memory for transferring bit signals between each of said bit lines and addressed ones of the memory elements in said row and for transferring said bit signals between said bit lines and said shift register means.

2. The invention of claim 1 further comprised of means for transferring signals in parallel between said shift register and said ones of the bit lines.

3. The invention of claim 2 wherein said signals transferring means includes means for routing signals on respective ones of said bit lines to respective shift locations within said shift register.

4. The invention of claim 3 further comprised of means for applying input signals to said shift register and means for receiving output signals from said shift register.

5. The invention of claim 4 wherein said input and output signals are streams of serial signals.

6. The invention of claim 4 further comprised of sense amplifier circuitry connected to said bit lines and wherein said shift register is positioned adjacent to said sense amplifier circuitry.

7. A memory disposed on an integrated circuit chip, said memory being comprised of at least one row-and-column array of memory elements, a plurality of parallel bit lines each aligned with a respective column of said array, first transfer means responsive to a first address identifying a row of said array for transferring stored signals between each of said bit lines and a respective one of the memory elements in said row, and second transfer means responsive to a second address identifying a column of said array for transferring said stored signals between a respective one of said bit lines and a random access terminal, characterized by a shift register disposed on said chip such that said shift register is directly connected to said bit lines at substantially the midpoint of said array and means for transferring said stored signals between said bit lines and respective shift locations of said shift register.

8. The invention of claim 7 further comprised of means for shifting bits of data to respective ones of said locations and wherein said third transfer means includes means for concurrently transferring said bits from each shift location to the respective bit line.

9. The invention of claim 7 wherein said third transfer means includes means for concurrently transferring signals on said bit lines into said respective shift locations and wherein said memory is further comprised of means for shifting the contents of said shift register to an output terminal.

10. The invention of claim 7 wherein said third transfer means includes means alternatively operative for connecting signals stored in each shift location to a respective one of said bit lines or decoupling said stored signals from said respective one of said bit lines.

11. A random access memory comprised of two rectangular arrays each comprised of individual memory elements arranged in rows and columns, a plurality of bit lines each running parallel to a respective one of the columns and connected to at least ones of the elements in said respective one of said columns, means operative in response to a first address for transferring signals between said bit lines and the elements in a row associated with said first address, a plurality of sense amplifiers operative in response to said signals for producing a plurality of bit signals on said bit lines, each bit signal being reflective of the value of a bit stored within a respective one of said elements comprising said associated row, a random access input terminal, a random access output terminal, means operative in response to a second address for transferring bit signals between a bit line associated with said second address and said random access input and output terminals, a serial input terminal, a serial output terminal, shift register means positioned between said memory arrays and connected to said bit lines for concurrently transferring bit signals between said bit lines and respective shift locations of said shift register means, and means for serially shifting bit signals between said shift register means and said serial input and output terminals.

* * * * *